(12) United States Patent
Kwon et al.

(10) Patent No.: US 10,355,672 B2
(45) Date of Patent: Jul. 16, 2019

(54) SEMICONDUCTOR DEVICE WITH POWER GATING SCHEME

(71) Applicant: SK hynix Inc., Gyeonggi-do (KR)

(72) Inventors: Gyu Wan Kwon, San Jose, CA (US); Jae Hyeong Kim, San Ramon, CA (US); Amal Akbar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/021,801

(22) Filed: Jun. 28, 2018

(65) Prior Publication Data

US 2019/0007031 A1 Jan. 3, 2019

Related U.S. Application Data

(60) Provisional application No. 62/526,724, filed on Jun. 29, 2017.

(51) Int. Cl.
*H03K 17/16* (2006.01)
*H03K 3/012* (2006.01)
*H03K 17/08* (2006.01)

(52) U.S. Cl.
CPC ............ *H03K 3/012* (2013.01); *H03K 17/08* (2013.01)

(58) Field of Classification Search
CPC ................................ H03K 3/012; H03K 17/08
USPC ......................................................... 327/389
See application file for complete search history.

(56) References Cited

U.S. PATENT DOCUMENTS

| 7,138,842 B2* | 11/2006 | Padhye | H03K 3/0375 327/203 |
| 8,816,741 B2* | 8/2014 | Liu | H03K 3/012 327/212 |
| 9,503,062 B2* | 11/2016 | Singh | H03K 3/0372 |
| 2009/0058485 A1* | 3/2009 | Berzins | H03K 3/356008 327/203 |

* cited by examiner

*Primary Examiner* — Ryan Jager
(74) *Attorney, Agent, or Firm* — IP & T Group LLP

(57) ABSTRACT

A semiconductor device includes: a power-gated logic circuit suitable for operating in response to a first power gating enable signal which is deactivated in a standby mode and activated in an active mode; a transmission unit suitable for selectively transmitting an output signal of the power-gated logic circuit to an output terminal in response to a third power gating enable signal; a clocked latch unit suitable for latching a signal of the output terminal in the standby mode and an initial stage of the active mode in response to a second power gating enable signal; and an internal circuit suitable for operating based on the signal of the output terminal, wherein the first to third power gating enable signals are sequentially activated.

10 Claims, 4 Drawing Sheets

SEMICONDUCTOR DEVICE WITH POWER GATING SCHEME

CROSS-REFERENCE TO RELATED APPLICATIONS

This application claims priority to U.S. Provisional Patent Application No. 62/526,724 entitled, "GLITCH REMOVING IN POWER GATING SCHEME", filed on Jun. 29, 2017, which is incorporated herein by reference in its entirety.

BACKGROUND

1. Field

Exemplary embodiments of the present invention relate to a semiconductor device with a power gating scheme.

2. Description of the Related Art

Digital devices, particularly mobile devices, are demanded to have low power consumption with a high-speed operation. In other words, the power source voltage VDD supplied to a logic circuit is required to be low, and the switching rate of the MOS (Metal-Oxide-Semiconductor) transistors forming the logic circuit is required to be fast. Actually, the power source voltage VDD supplied to the logic circuit has been lowered down to approximately 1.2V, and the thickness of a gate oxide layer of the MOS transistors has become slimmer to approximately 35 Å or less. Meanwhile, the use of such slim transistors helps improve the switching rate by lowering a threshold voltage, but it inevitably increases the leakage current or off current. Leakage currents have a negative influence on the battery time in battery-operated systems with long latencies, such as mobile devices.

A power gating scheme has been applied as a solution to solve the problem of leakage current in such a digital logic circuit. The power gating scheme may improve the operating speed of the logic circuit by supplying power (power source voltage or ground voltage) to a logic circuit having transistors with low threshold voltages by turning on a power gating switch in an active mode of the logic circuit, and in a standby mode, the power gating switch may be turned off to cut off the power applied to the logic circuit, thereby reducing the leakage current of the digital logic circuit. To be specific, MOS transistors having a relatively high threshold voltage may be coupled in series between a power source voltage terminal and the logic circuit or between a ground voltage terminal and the logic circuit.

SUMMARY

Embodiments of the present invention are directed to a semiconductor device that may prevent a malfunction from occurring in an internal circuit due to a glitch that occurs in a power-gated logic circuit when a mode is switched.

In accordance with an embodiment of the present invention, a semiconductor device includes: a power-gated logic circuit suitable for operating in response to a first power gating enable signal which is deactivated in a standby mode and activated in an active mode; a transmission unit suitable for selectively transmitting an output signal of the power-gated logic circuit to an output terminal in response to a third power gating enable signal; a clocked latch unit suitable for latching a signal of the output terminal in the standby mode and an initial stage of the active mode in response to a second power gating enable signal; and an internal circuit suitable for operating based on the signal of the output terminal, wherein the first to third power gating enable signals are sequentially activated.

In accordance with another embodiment of the present invention, a semiconductor device includes: a first power-gated logic circuit suitable for operating in response to a first power gating enable signal which is deactivated in a standby mode and activated in an active mode; a second power-gated logic circuit suitable for receiving an output signal of the first power-gated logic circuit, and operating in response to a third power gating enable signal; a transmission unit suitable for selectively transmitting an output signal of the power-gated logic circuit to an output terminal in response to the third power gating enable signal; a clocked latch unit suitable for latching a signal of the output terminal in the standby mode and an initial stage of the active mode in response to a second power gating enable signal; and an internal circuit suitable for operating based on the signal of the output terminal, wherein the first to third power gating enable signals are sequentially activated.

DETAILED DESCRIPTION

Figure 1A:
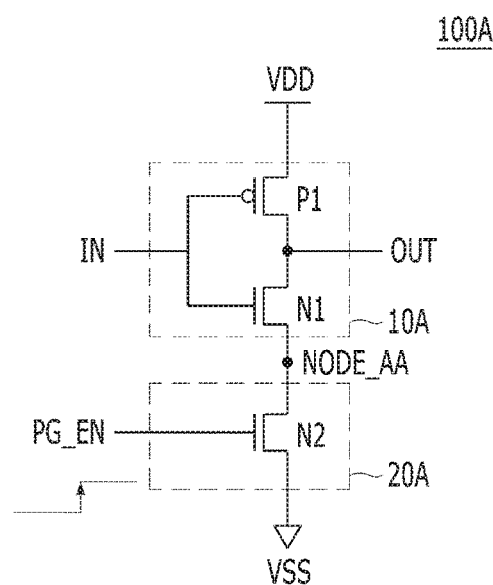
FIGS. 1A and 1B exemplarily illustrate a power-gated logic circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
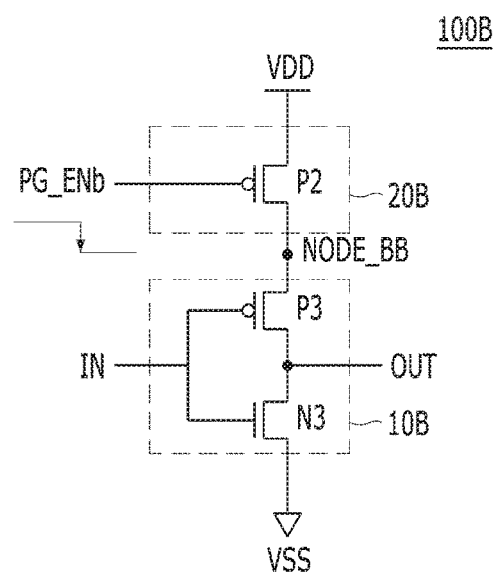

FIGS. 1A and 1B exemplarily illustrate a power-gated logic circuit.

First of all, referring to FIG. 1A, the power-gated logic circuit 100A may include a logic unit 10A and a power gating switch 20A coupled in series between a power source voltage terminal VDD and a ground voltage terminal VSS. The logic unit 10A may be coupled to the power source voltage terminal VDD and perform a predetermined logic operation onto an input signal IN to output an output signal OUT. The power gating switch 20A may be coupled between the logic unit 10A and the ground voltage terminal VSS, and the power gating switch 20A may activate a current path between the power source voltage terminal VDD and the ground voltage terminal VSS in response to a power gating enable signal PG_EN so as to enable the operation of the logic unit 10A. Herein, the logic unit 10A may be realized with a CMOS inverter including a PMOS transistor P1 and an NMOS transistor N1, and the power gating switch 20A may be realized with an NMOS transistor N2. The power gating enable signal PG_EN may be activated in the active mode to a logic high level, and may be deactivated to a logic low level in a standby mode. The NMOS transistor N2 may be turned on in the active mode to couple the logic unit 10A and the ground voltage VSS with each other.

Also, referring to FIG. 1B, the power-gated logic circuit 100B may include a power gating switch 20B and a logic unit 10B that are serially coupled between the power source voltage terminal VDD and the ground voltage terminal VSS. The logic unit 103 may be coupled to the ground voltage terminal VSS, and perform a predetermined logic operation onto the input signal IN to output the output signal OUT. The power gating switch 20B may be coupled between the logic unit 10B and the power source voltage terminal VDD, and activate a current path between the power source voltage terminal VDD and the ground voltage terminal VSS in response to the power gating enable signal PG_Enb so as to enable the operation of the logic unit 10B.

Herein, the logic unit 10B may be realized with a CMOS inverter including a PMOS transistor P3 and an NMOS transistor N3, and the power gating switch 20B may be realized with a PMOS transistor P2. The power gating enable signal PG_ENb may be activated in the active mode to a logic low level and deactivated in a standby mode (or a power down mode) to a logic high level. The PMOS transistor P2 may be turned on in the active mode to couple the logic unit 10B and the power source voltage terminal VDD with each other.

Herein, the logic units 10A and 10B may include another logic which is not an inverter, such as a NAND gate and a NOR gate. The power gating switches 20A and 20B may be turned on in the active mode to perform a predetermined operation of the logic units 10A and 10B and turned off in the standby mode to cut off the leakage current path. To this end, the NMOS transistor N2 and the PMOS transistor P2 may be designed to have a sufficiently thick gate oxide layer so as to secure a high threshold voltage which is favorable for reducing the leakage current.

However, when the power gating switches 20A and 20B are turned off in the standby mode, coupling nodes NODE_AA and NODE_BB may float and become unstable, which may cause a glitch when the mode is switched into the active mode.

Figure 2:
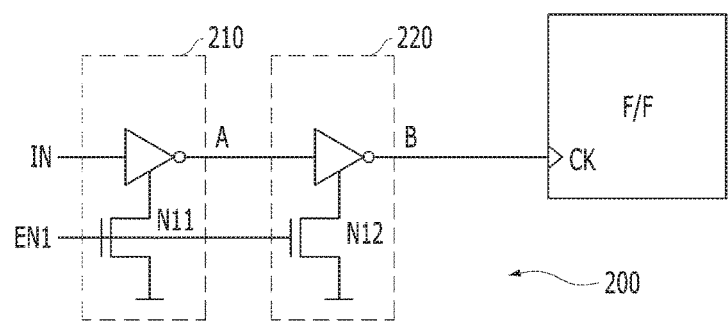
FIG. 2 is a schematic diagram exemplarily illustrating a semiconductor device with a power gating scheme.

FIG. 2 is a schematic diagram exemplarily illustrating a semiconductor device 200 with a power gating scheme.

Referring to FIG. 2, the semiconductor device 200 may include a first power-gated logic circuit 210, a second power-gated logic circuit 220, and a flip-flop F/F. The first power-gated logic circuit 210 may receive the input signal IN, and the second power-gated logic circuit 220 may receive the output signal of the first power-gated logic circuit 210. The flip-flop F/F may be provided as an example of the internal circuit of the semiconductor device 200, and the input signal IN is inputted to a clock terminal CK of the flip-flop F/F after passing through the first and second power-gated logic circuits 210 and 220 in the example. Each of the first and second power-gated logic circuits 210 and 220 may include a power-gated inverter. In other words, each of the first and second power-gated logic circuits 210 and 220 may be provided with a CMOS inverter that uses a NMOS transistor N11 and N12 having a power gating enable signal EN1 as a gate input as a power gating switch. Each of the CMOS inverters may correspond to the PMOS transistor P1 and the NMOS transistor N1 of FIG. 1A. Each of the NMOS transistors N11 and N12 may correspond to the NMOS transistor N2 of FIG. 1A, and the power gating enable signal EN1 may correspond to the power gating enable signal PG_EN of FIG. 1A.

Figure 3:
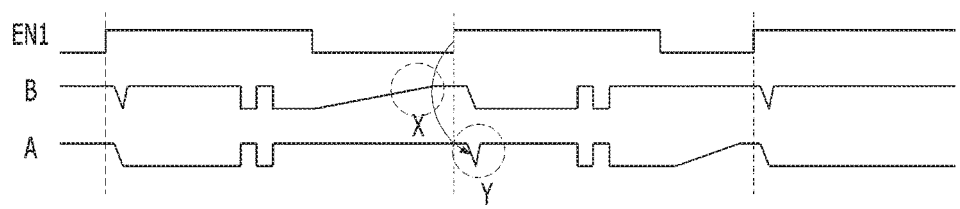
FIG. 3 is a waveform diagram illustrating an operation of the semiconductor device shown in FIG. 2.

FIG. 3 is a waveform diagram illustrating an operation of the semiconductor device shown in FIG. 2.

First of all, when the semiconductor device 200 is in the active mode, the power gating enable signal EN1 may be activated to a logic high level, and when the semiconductor device 200 is in the standby mode (or the power down mode), the power gating enable signal EN1 EN1) may be deactivated to a logic low level.

In the active mode, it is assumed that the power gating enable signal EN1 is activated and the CMOS inverter of the first power-gated logic circuit 210 operates normally to output a signal of a logic low level. Meanwhile, in standby mode, when the power gating enable signal EN1 is deactivated and the CMOS inverter of the first power-gated logic circuit 210 is disabled, the coupling node NODE_AA (see FIG. 1A) of the NMOS transistor N11 and the CMOS inverter is in a floating state, and the output node A of the first power-gated logic circuit 210 is charged by the leakage current and its potential rises (see the reference symbol 'X'). Herein, since the second power-gated logic circuit 220 finally outputs a signal of a logic high level in the active mode, the output node B may maintain the logic high level even in the standby mode. In this state, when the power gating enable signal EN1 is activated again in the active mode, a glitch (see the reference symbol 'Y') may occur at the output node B of the second power-gated logic circuit 220.

This glitch occurring process will be discussed in more detail. Even if the power gating enable signal EN1 is activated in the active mode, it takes as much time as a propagation delay of the two CMOS inverters until the level of the actual input signal IN is reflected to the output node B of the second power-gated logic circuit 220. Therefore, a pull-down operation for the output node B may be performed regardless of the level of the actual input signal IN, and the potential may drop sharply. Subsequently, when the input signal IN is applied in a logic high level, the first power-gated logic circuit 210 may normally operate to pull the output node A down to a logic low level, and the output node B may rise back to a logic high level by the second power-gated logic circuit 220 that receives a value of a logic low level. As a result, after the active mode starts, the logic level of the output node B may transition to high-→low→high state, and when a signal including the glitch is applied to the clock terminal CK of the flip flop F/F, the flip-flop F/F may malfunction.

Figure 4:
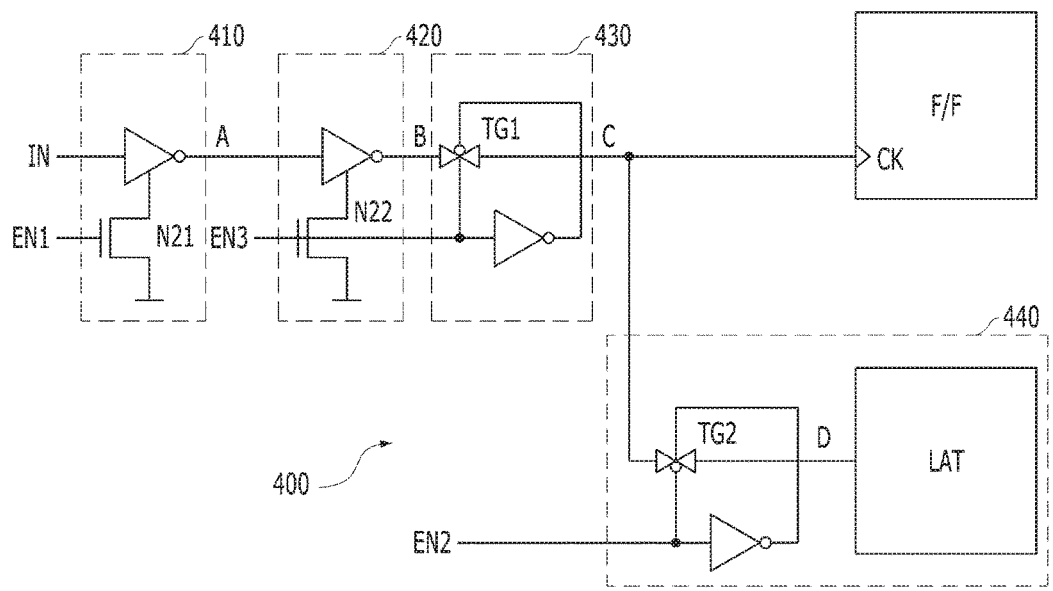
FIG. 4 is a schematic diagram illustrating a semiconductor device with a power gating scheme in accordance with an embodiment of the present invention.

FIG. 4 is a schematic diagram illustrating a semiconductor device 400 with a power gating scheme in accordance with an embodiment of the present invention.

Referring to FIG. 4, the semiconductor device 400 may include power-gated logic circuits 410 and 420, a transmission unit 430, a clocked latch unit 440, and a flip-flop F/F. The flip-flop F/F may be provided as an example of an internal circuit of the semiconductor device 400. The example shows an input signal IN inputted to the clock terminal CK of the flip-flop F/F after passing through the power-gated logic circuits 410 and 420 and the transmission portion 430.

The power-gated logic circuits 410 and 420 may operate in response to a first power gating enable signal EN1 that is deactivated in a standby mode and activated in an active mode, and the power-gated logic circuits 410 and 420 may include a first power-gated logic circuit 410 and a second power-gated logic circuit 420.

The first power-gated logic circuit 410 may receive an input signal IN and the second power-gated logic circuit 420 may receive an output signal of the first power-gated logic circuit 410. Herein, each of the first and second power-gated logic circuits 410 and 420 may include a power-gated inverter. To be specific, the first power-gated logic circuit 410 may include a CMOS inverter using an NMOS transistor N21 whose gate input is the first power gating enable signal EN1 as a power gating switch. The second power-gated logic circuit 420 may also include a CMOS inverter using an NMOS transistor N22 whose gate input is a third power gating enable signal EN3 as a power gating switch. Each of the CMOS inverters may correspond to the PMOS transistor P1 and the NMOS transistor N1 of FIG. 1A, and each of the NMOS transistors N21 and N22 may correspond to the NMOS transistor N2 of FIG. 1A, and the first power gating enable signal EN1 may correspond to the power gating enable signal PG_EN of FIG. 1A. In other words, the first power gating enable signal EN1 may be activated to a logic high level in the active mode and deactivated to a logic low level in the standby mode (or the power down mode). The third power gating enable signal EN3 may have a different activation/deactivation timing from those of the first power gating enabling signal EN1.

The transmission unit 430 may be interposed between the output node B and an output terminal C and output an output signal of the second power-gated logic circuit 420 to the clock terminal CK of the output terminal C (the flip-flop F/F) in response to the third power gating enable signal EN3. To be specific, the transmission unit 430 may include an inverter for generating an inverted signal of the third power gating enable signal EN3, and a first transmission gate TG1 coupled between the output node B and the output terminal C of the second gated logic circuit 420 under the control of the third power gating enable signal EN3 and its inverted signal. The first transmission gate TG1 may transmit a signal in a section that the third power gating enable signal EN3 is in a logic high level.

The clocked latch unit 440 may be coupled in parallel to the output terminal C and latches the output terminal C in the standby mode and the initial stage of the active mode in response to the second power gating enable signal EN2. To be specific, the clocked latch unit 440 may include an inverter for generating an inverted signal of the second power gating enable signal EN2, a second transmission gate TG2 coupled between the output terminal C and a latching node D under the control of the second power gating enable signal EN2 and its inverted signal, and a latch LAT latching a signal of the latching node D. Herein, the second power gating enable signal EN2 may have different activation/deactivation timings from those of the first and third power gating enable signals EN1 and EN3.

Figure 5:
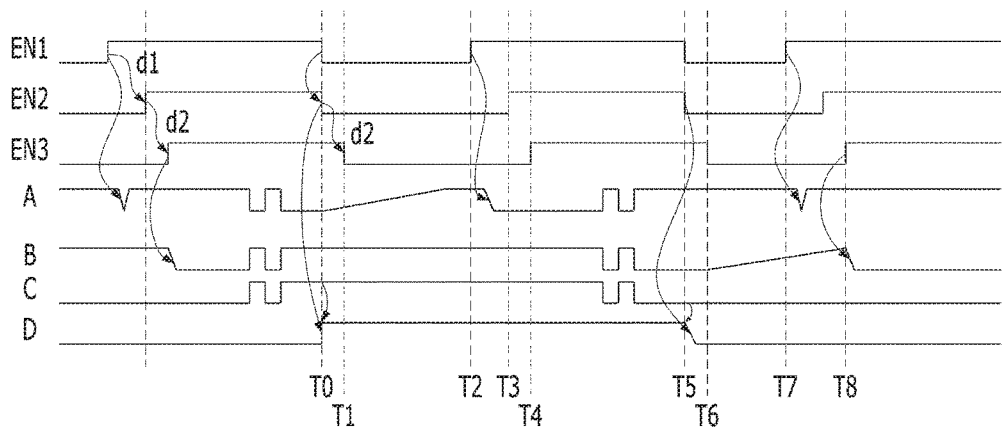
FIG. 5 is a waveform diagram illustrating an operation of the semiconductor device shown in FIG. 4.

FIG. 5 is a waveform diagram illustrating an operation of the semiconductor device 400 shown in FIG. 4. Hereafter, the operation of the semiconductor device 400 is described with reference to FIGS. 1A, 4 and 5.

The first power gating enable signal EN1 may be activated to a logic high level when the semiconductor device 400 is in the active mode, and the first power gating enable signal EN1 may be deactivated to a logic low level when the semiconductor device 400 is in the standby mode (or the power down mode).

First, in the active mode, it is assumed that the first to third power gating enable signals EN1, EN2 and EN3 may be activated so that the CMOS inverters of the first and second power-gated logic circuits 410 and 420 may operate normally and the output terminal C is in a logic high level. Herein, the nodes A and D are in a logic low level, and the node B is in a logic high level.

Figure 6:
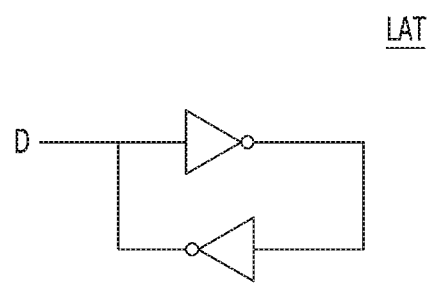
FIG. 6 is a circuit diagram illustrating an example of a latch LAT shown in FIG. 4.

When the semiconductor device 400 enters the standby mode, the first and second power gating enable signals EN1 and EN2 are deactivated to a logic low level (T0). As a result, the second transmission gate TG2 may be turned on to transmit the logic level of the output terminal C to the latching node D. The latch LAT may maintain the level of the latching node D until another level of a signal is delivered. FIG. 6 is a circuit diagram illustrating an example of a latch LAT shown in FIG. 4. As shown in FIG. 6, the latch LAT may be realized using two inverters.

Subsequently, the third power gating enable signal EN3 may be deactivated in a logic low level to disable the second power-gated logic circuit 420 and the transmission unit 430 (T1). Herein, the coupling node NODE_AA (see FIG. 1A) of the NMOS transistor N21 and the CMOS inverter may be a floating state, and the output node A of the first power-gated logic circuit 410 may be charged by the leakage current so that its potential is increased.

Meanwhile, when the semiconductor device 400 exits from the standby mode and enters the active mode again, the first power gating enable signal EN1 may be activated to the logic high level (T2). Thus, the first power-gated logic circuit 410 may be enabled to transition the output node A to a logic low level. Herein, the second power-gated logic circuit 420 and the transmission portion 430 may not react to the transition of the output node A because the second and third power gating enable signals EN2 and EN3 are still kept in a logic low level, and the clocked latch unit 440 may maintain the level of the output terminal C in a logic high level.

Subsequently, the second power gating enable signal EN2 may be activated to a logic high level to disable the clocked latch unit 440 (T3), and then the third power gating enable signal EN3 may be set to a logic high level to enable the second power-gated logic circuit 420 and the transmission portion 430 (T4).

As described above, according to the embodiment of the present invention, when the semiconductor device 400 is switched from the standby mode to the active mode, the output terminal C may be maintained at a stable level by the clocked latch unit 440, and since the second power-gated logic circuit 420 and the transmission unit 430 do not operate, no glitches may occur.

Second, in the active mode, it is assumed that the first to third power gating enable signals EN1, EN2 and EN3 may be activated so that the CMOS inverters of the first and second power-gated logic circuits 410 and 420 may operate normally and the output terminal C may be in a logic low level. Herein, the nodes A and D are in a logic high level and the node B is in a logic low level.

When the semiconductor device 400 enters the standby mode, the first and second power gating enable signals EN1 and EN2 may be deactivated at a logic low level (T5). As a result, the second transmission gate TG2 may be turned on to transmit the logic level of the output terminal C to the latching node D. In short, the latching node D may transition to a logic low level.

Subsequently, the third power gating enable signal EN3 may be deactivated to a logic low level to disable the second power-gated logic circuit 420 and the transmission unit 430 (T6). Herein, the coupling node NODE_AA (see FIG. 1A) of the NMOS transistor N22 and the CMOS inverter may be in a floating state, and the output node B of the second power-gated logic circuit 420 may be charged by a leakage current so that its potential may be increased. However, since the transmission unit 430 is disabled and the clocked latch portion 440 is operating, the level of the output terminal C is not changed.

Meanwhile, when the semiconductor device 400 exits from the standby mode and enters the active mode again, the first power gating enable signal EN1 may be activated to a logic high level (T7). In this case, the output node A of the first power-gated logic circuit 410 may momentarily fall, but soon the logic level may resume by the operation of the CMOS inverter of the first power-gated logic circuit 410. Herein, the second power-gated logic circuit 420 and the transmission unit 430 do not react to the transition of the output node A because the second and third power gating enable signals EN2 and EN3 are still kept in a logic low level, and the clocked latch unit 440 may maintain the level of the output terminal C in a logic low level.

Subsequently, the second power gating enable signal EN2 may be activated to a logic high level to disable the clocked latch unit 440 (T7), and then the third power gating enable signal EN3 may be activated to a logic high level to enable the second power-gated logic circuit 420 and the transmission unit 430 (T8). Thus, the output node B of the second power-gated logic circuit 420 may transition to a logic low level, but the output terminal C may maintain the same value because it was in a logic low level before.

As described above, according to the embodiment of the present invention, when the semiconductor device 400 is switched from the standby mode to the active mode, the output terminal C may be maintained at a stable level by the clocked latch unit 440, and since the second power-gated logic circuit 420 and the transmission unit 430 operate in this state, no glitches may occur.

Figure 7:
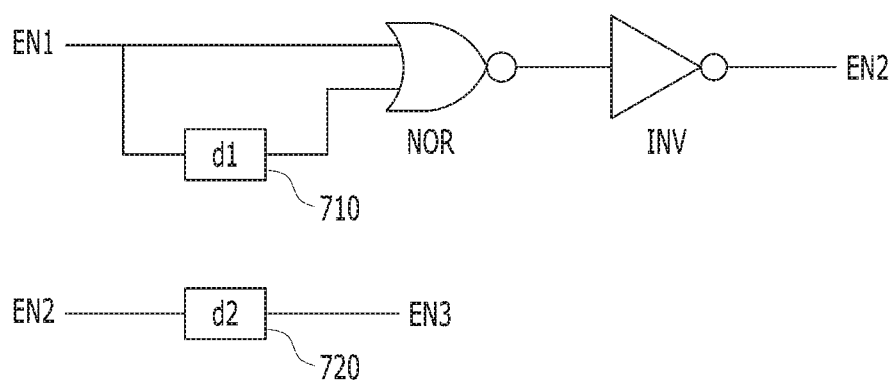
FIG. 7 illustrates a signal generation circuit for realizing the waveform of second and third power gating enable signals shown in FIG. 5.

FIG. 7 illustrates a signal generation circuit for realizing the waveform of the second and third power gating enable signals EN2 and EN3 shown in FIG. 5.

Referring to FIG. 7, the second power gating enable signal EN2 may be formed by using a rising edge-triggered delayer. To be specific, the rising edge-triggered delayer may include a first delay 710 for delaying the first power gating enable signal EN1 by a first delay value d1, a NOR gate NOR receiving the first power gating enable signal EN1 and an output signal of the first delay 710 as an input, and an inverter INV for inverting an output signal of the NOR gate NOR to output the second power gating enable signal EN2. Of course, other forms of realization may be possible.

The third power gating enable signal EN3 may be realized by using a second delay 720 which simply delays the second power gating enable signal EN2 by the second delay value d2. Of course, it is also possible to realize a rising edge and a falling edge to have different delay values.

The first delay value d1 of the first delay 710 and the second delay value d2 of the second delay 720 may be determined by the designer in consideration of the propagation delay and the operation margin of the CMOS inverter.

In the embodiment of the present invention, the first to third power gating enable signals EN1, EN2 and EN3 may be sequentially activated. Meanwhile, referring to FIG. 5, a case where the first and second power gating enable signals EN1 and EN2 are deactivated simultaneously and the third power gating enable signal EN3 is deactivated thereafter is described as an example. However, when the mode is switched from the active mode to the standby mode, there is no big issue in terms of the occurrence of a glitch. Therefore, the order and timing of deactivation of the first to third power gating enable signals EN1, EN2 and EN3 may be set somewhat differently.

Meanwhile, the embodiment of FIG. 4 describes a case (see FIG. 1A) where the logic unit is realized with the CMOS inverter and the power gating switch is realized with the NMOS transistor, when the first and second power-gated logic circuits 410 and 420 are realized. However, the technology of the present invention may also be applied to a case where the power gating switch is realized with a PMOS transistor (see FIG. 1B). In this case, the glitch will appear being pulsed from low to high. Also, when the first and second power-gated logic circuits 410 and 420 are formed, it is also possible to realize the logic unit with another logic, for example, a NAND gate or a NOR gate, without realizing it with a CMOS inverter. Meanwhile, the technology of the present invention may also be applied to a case where the first power-gated logic circuit 410 is replaced with another circuit.

According to the embodiments of the present invention, it is possible to prevent a malfunction from occurring in an internal circuit which receives a signal of the logic circuit even if a glitch occurs in a power-gated logic circuit.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a power-gated logic circuit suitable for operating in response to a first power gating enable signal which is deactivated in a standby mode and activated in an active mode;
    a transmission unit suitable for selectively transmitting an output signal of the power-gated logic circuit to an output terminal in response to a third power gating enable signal;
    a clocked latch unit suitable for latching a signal of the output terminal in the standby mode and an initial stage of the active mode in response to a second power gating enable signal; and
    an internal circuit suitable for operating based on the signal of the output terminal,
    wherein the first to third power gating enable signals are sequentially activated.

2. The semiconductor device of claim 1, wherein the first and second power gating enable signals are deactivated upon entering the standby mode, and the third power gating enable signal is deactivated when a predetermined delay time passes after entering the standby mode.

3. The semiconductor device of claim 1, wherein the transmission unit includes a first transmission gate that is enabled during an active period of the third power gating enable signal.

4. The semiconductor device of claim 1, wherein the clocked latch unit includes:
    a second transmission gate that is enabled during a deactivation period of the second power gating enable signal; and
    a latch suitable for latching a signal of the output terminal of the second transmission gate.

5. A semiconductor device, comprising:
a first power-gated logic circuit suitable for operating in response to a first power gating enable signal which is deactivated in a standby mode and activated in an active mode;
a second power-gated logic circuit suitable for receiving an output signal of the first power-gated logic circuit, and operating in response to a third power gating enable signal;
a transmission unit suitable for selectively transmitting an output signal of the second power-gated logic circuit to an output terminal in response to the third power gating enable signal;
a clocked latch unit suitable for latching a signal of the output terminal in the standby mode and an initial stage of the active mode in response to a second power gating enable signal; and
an internal circuit suitable for operating based on the signal of the output terminal,
wherein the first to third power gating enable signals are sequentially activated.

6. The semiconductor device of claim 5, wherein the first and second power gating enable signals are deactivated upon entering the standby mode, and the third power gating enable signal is deactivated when a predetermined delay time passes after entering the standby mode.

7. The semiconductor device of claim 5, wherein the transmission unit includes a first transmission gate that is enabled during an active period of the third power gating enable signal.

8. The semiconductor device of claim 5, wherein the clocked latch unit includes:
a second transmission gate that is enabled during a deactivation period of the second power gating enable signal; and
a latch suitable for latching a signal of the output terminal of the second transmission gate.

9. The semiconductor device of claim 5, wherein each of the first and second power-gated logic circuits includes a power-gated inverter.

10. The semiconductor device of claim 9, wherein the power-gated inverter includes an NMOS transistor that is coupled to a ground voltage terminal as a power gating switch.

* * * * *